United States Patent
Holbery et al.

(10) Patent No.: US 10,355,371 B2
(45) Date of Patent: Jul. 16, 2019

(54) FLEXIBLE CONDUCTIVE BONDING

(71) Applicant: Microsoft Technology Licensing, LLC, Redmond, WA (US)

(72) Inventors: James David Holbery, Bellevue, WA (US); Siyuan Ma, Bothell, WA (US); Flavio Protasio Ribeiro, Bellevue, WA (US); Michael David Dickey, Redmond, WA (US); Collin Alexander Ladd, Sammamish, WA (US); Andrew Lewis Fassler, Seattle, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 15/449,808

(22) Filed: Mar. 3, 2017

(65) Prior Publication Data
US 2018/0254566 A1    Sep. 6, 2018

(51) Int. Cl.
*H01R 3/08* (2006.01)
*H01R 12/61* (2011.01)
(Continued)

(52) U.S. Cl.
CPC ........... *H01R 3/08* (2013.01); *H01L 23/4985* (2013.01); *H01L 23/49866* (2013.01); *H01L 24/69* (2013.01); *H01L 24/89* (2013.01); *H01R 12/613* (2013.01); *H05K 1/028* (2013.01); *H05K 1/09* (2013.01); *H05K 1/111* (2013.01); *H05K 1/18* (2013.01); *H05K 3/10* (2013.01); *H05K 3/28* (2013.01); *H05K 3/34* (2013.01); *H01L 23/5389* (2013.01); *H05K 2201/05* (2013.01); *H05K 2201/10977* (2013.01)

(58) Field of Classification Search
USPC .................................................. 361/749, 748
See application file for complete search history.

(56) References Cited

U.S. PATENT DOCUMENTS 6,108,210 A    8/2000    Chung
6,228,681 B1   5/2001    Gilleo et al.
(Continued)

FOREIGN PATENT DOCUMENTS

EP    0620591 A1    10/1994
EP    3018705 A1    5/2016
(Continued)

OTHER PUBLICATIONS

"Chip-on-Flex Rework", http://web.archive.org/web/20101101091402/http://www.finetechusa.com/rework/applications/chip-on-flex-rework.htmlhttp://www.finetechusa.com/rework/applications/chip-on-flex-rework.html, Published on: Nov. 1, 2010, 1 pages.
(Continued)

*Primary Examiner* — Andargie M Aychillhum
(74) *Attorney, Agent, or Firm* — Alleman Hall & Creasman & Tuttle LLP

(57) ABSTRACT

Examples are disclosed that relate to flexible electrical interconnects in electronic devices. One example provides a device including a flexible substrate, a conductive trace disposed on the flexible substrate, an electronic component mounted to the flexible substrate, a liquid metal interconnect bridging between a pad on the component and the trace on the flexible substrate, and an encapsulant covering the interconnect.

20 Claims, 3 Drawing Sheets

(51) Int. Cl.
*H01L 23/00* (2006.01)
*H05K 1/02* (2006.01)
*H05K 1/18* (2006.01)
*H05K 1/11* (2006.01)
*H05K 1/09* (2006.01)
*H05K 3/28* (2006.01)
*H05K 3/10* (2006.01)
*H05K 3/34* (2006.01)
*H01L 23/498* (2006.01)
*H01L 23/538* (2006.01)

(56) References Cited

U.S. PATENT DOCUMENTS

| | | |
|---|---|---|
| 6,940,182 B2 | 9/2005 | Hilton et al. |
| 7,394,028 B2 | 7/2008 | Cohn |
| 7,541,209 B2 | 6/2009 | Haluzak et al. |
| 7,964,964 B2 | 6/2011 | Sheats |
| 7,982,305 B1 | 7/2011 | Railkar et al. |
| 8,319,114 B2 | 11/2012 | Cheng et al. |
| 8,664,039 B2 | 3/2014 | Sung et al. |
| 2003/0049884 A1 | 3/2003 | Lutz |
| 2003/0180013 A1* | 9/2003 | Rosenberg ............ H01L 25/167 385/92 |
| 2009/0001576 A1* | 1/2009 | Tuli ................. H01L 23/49827 257/750 |
| 2009/0273083 A1 | 11/2009 | Sauciuc et al. |
| 2011/0298871 A1 | 12/2011 | Stephens et al. |
| 2012/0250282 A1 | 10/2012 | Bader |
| 2013/0243655 A1 | 9/2013 | Li et al. |
| 2013/0314707 A1* | 11/2013 | Shastri .................. G01B 11/14 356/399 |
| 2014/0124941 A1* | 5/2014 | Sakamoto ........... H01L 25/0657 257/773 |
| 2015/0354318 A1 | 12/2015 | Wright |

FOREIGN PATENT DOCUMENTS

| | | |
|---|---|---|
| GB | 2521619 A | 7/2015 |
| JP | 2015174129 A | 10/2015 |
| WO | 2014093809 A1 | 6/2014 |

OTHER PUBLICATIONS

Byle, Fritz, "Impact of Flip Chip on Flex Processes", http://web.archive.org/web/20150531044420/http:/electroiq.com/blog/2004/11/impact-of-flip-chip-on-flex-processes, Published on: May 31, 2015, 7 pages.

"Glob Top Epoxies", http://www.masterbond.com/industries/glob-top-epoxies, Retrieved on: Nov. 17, 2016, 2 pages.

Dunkerton, S B, "Glob Top Materials to Chip on Board Components", In International Conference on Advances in Welding Technology, Sep. 30, 1998, pp. 1-17.

Juskey, Frank, "QFN Packages Quell Noise, Cost, Space in Handhelds", http://www.eetimes.com/document.asp?doc_id=1227167, Published on: Aug. 26, 2002, 6 pages.

"International Search Report and Written Opinion Issued in PCT Application No. PCT/US18/019613", dated May 15, 2018, 11 Pages.

* cited by examiner

FLEXIBLE CONDUCTIVE BONDING

BACKGROUND

In chip-on-flex assemblies, rigid electronic components may be coupled to flexible components, such as a flexible printed circuit board.

SUMMARY

Examples are disclosed that relate to flexible electrical interconnects in electronic devices. One example provides a device including a flexible substrate, a conductive trace disposed on the flexible substrate, an electronic component mounted to the flexible substrate, a liquid metal interconnect bridging between a pad on the component and the trace on the flexible substrate, and an encapsulant covering the interconnect.

Another example provides a device comprising a flexible substrate, a conductive trace disposed on the substrate, an electronic component mounted to the substrate in a flexible region of the substrate, the electronic component comprising a pad spaced from the conductive trace, and an interconnect bridging between the pad and the conductive trace to contact the pad and the trace on a common side of the interconnect, the interconnect comprising a conductive path extending from a surface of the conductive trace.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Electrical interconnects may be incorporated into a variety of devices to provide electrical pathways between device components. Some electronic devices may incorporate flexible printed circuits to permit electrical signals to be carried across portions of the device that move during use. In some such devices, rigid electronic components, such as packaged computer chips, may be coupled to flexible components, such as polyimide-supported interconnects.

However, methods used to electrically and mechanically mount rigid electronic components to flexible components may employ rigid materials, such as tin-based solder alloys. This may impact the flexibility and durability of the resulting chip-on-flex structure. For example, an integrated circuit sourced as a packaged silicon die may be soldered to a flexible printed circuit. The solder used to bond the packaged integrated circuit to the flexible printed circuit may use metallic alloys that melt and reflow at sufficiently high temperatures, but fracture, delaminate, or otherwise failunder deforming stresses after assembly.

To avoid the potentially large impact on flexibility of a packaged electronic component, a bare, unpackaged circuit die may be attached to a flexible substrate with solder or adhesive, electrically connected with wire bonds, and encapsulated with resin (e.g., epoxy or silicone). The resulting assembly may be smaller than a packaged circuit die and thus have a lesser impact on flexibility. However, such a structure also may not be tolerant of repeated movements, which may cause delamination of the encapsulant and fracture the solder bonds and/or wire bonds. Additionally, bare dies mounted in such a manner may be subject to failure when bent with a small radius of curvature. Further, in either of these example processes, the final assembly may not be flexible or may be significantly less flexible than the substrate. As such, flexing of devices that are bonded in one of the above-described manners may cause mechanical bonds and/or electrical contacts to break and irreversibly fail.

Figure 1:
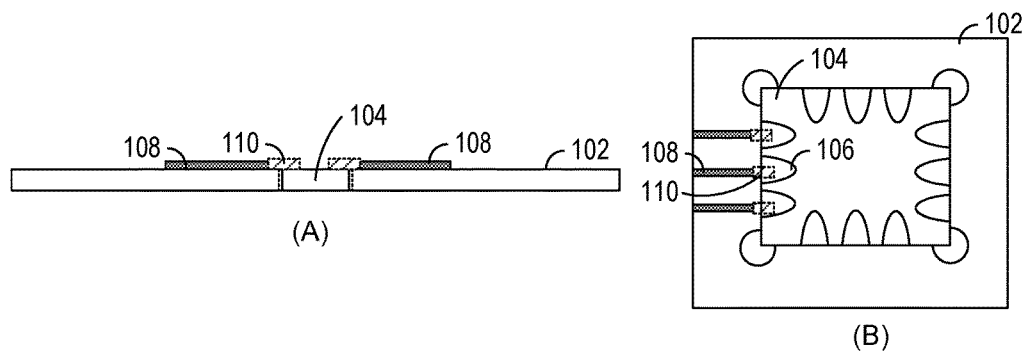
FIG. 1 schematically shows a front view and a side view of a first example electronic assembly including a flexible interconnect.

Accordingly, examples are disclosed that relate to electrically coupling rigid electronic components to flexible substrates and/or flexible circuits using flexible interconnects, such as a liquid metal covered with an encapsulant or a conductive polymer. FIG. 1 shows a first example of a device 100 incorporating a flexible interconnect. View (A) shows a side view of the device 100, and view (B) shows a top view of the device 100. First referring to view (A), the device 100 includes a flexible substrate 102 comprising an opening that accommodates an electronic component 104, such as an electronic chip. In some examples, the opening in the substrate may match the dimensions of the electronic component to be inserted during assembly (e.g., such that there is substantially no gap between side surfaces of the electronic component and sides of the opening in the substrate). In other examples, the opening in the substrate may be sized larger or smaller than the component. The opening in the substrate may be formed in any suitable manner. As examples, the opening may be cut during manufacturing of the substrate (e.g. by die cutting or laser cutting), or at a later processing stage, such as after formation of conductive traces on the flexible substrate.

In some examples, an opening in a substrate may be modified from a shape matching a perimeter of the component to distribute stresses and prevent delamination of an encapsulant. As one example, an opening may have a generally rectangular shape to match a component perimeter shape, but may include semicircular cutouts at each corner, as shown at 105 in view (B) of FIG. 1. Such rounded corners of the opening may create an extra air gap between sides of the opening and sides of the electronic component to help distribute stresses and prevent delamination.

The electronic component 104 includes a plurality of conductive pads 106 that provide locations for connecting conductive elements to the component. In the example of FIG. 1, the pads 106 are facing upward and away from the substrate, and the conductive traces 108 are disposed on a top surface of the substrate. The conductive traces may be formed of any suitable conductive material(s), such as silver, copper, and/or plated materials.

Figure 4:
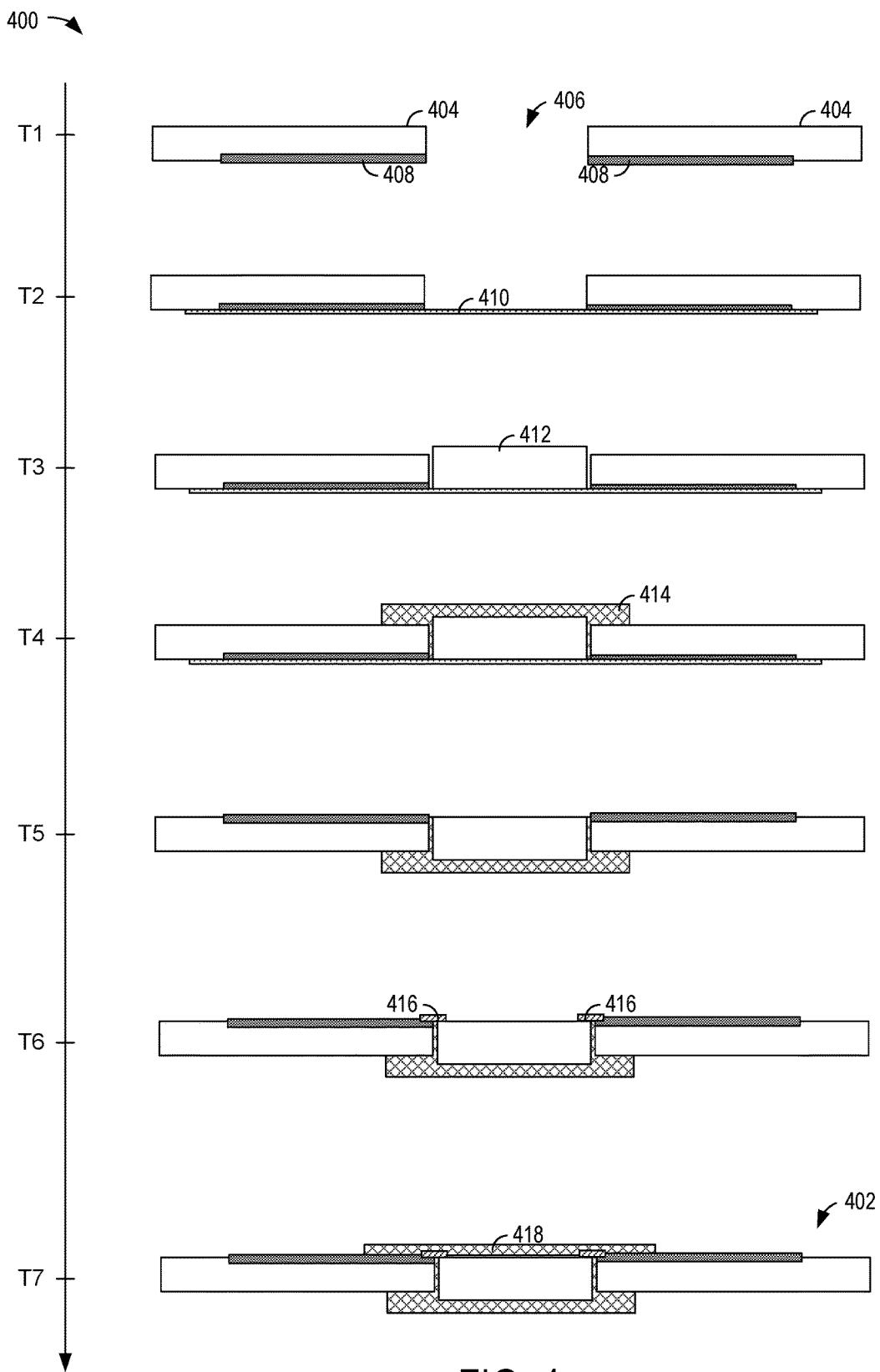
FIG. 4 schematically illustrates an example process for assembling an electronic device comprising a flexible interconnect.

As shown in FIG. 1, a flexible interconnect material 110 connects each conductive trace 108 to its respective contact pad 106, such that each flexible interconnect extends over the top of the respective contact pad 106 and conductive trace 108. In this manner, each flexible interconnect 110 bridges between the conductive trace 108 and contact pad 106, whether these components are separated by a gap or are in contact. This may allow the joint between the contact pad 106 and trace 108 to flex without breaking the electrical connection between these components. Further, where a liquid metal conductor is used to form the flexible interconnect 110, the liquid metal conductor also may help to provide self-healing characteristics by covering a region of the conductive trace 108 with liquid metal, as the liquid metal may bridge any gaps caused by fractures in the conductive trace 108 that arise from repeated stresses. In the configuration of FIG. 1, both the pads of the electronic component and the conductive traces are in contact with a same side of the interconnect 110, shown as the bottom surface in FIG. 1. It is to be understood that terms of orientation such as "bottom" or "top" may be used herein to refer to orientations of the components with reference to each other, such that the identities of "top" and "bottom" surfaces of a device are not dependent upon an orientation of the device. While not depicted in FIG. 1, an encapsulant (e.g. a layer of a silicone or other elastomer) is deposited over the liquid metal interconnect to fix the liquid metal within a desired space. An example encapsulant structure is depicted in FIG. 4, described below.

Figure 2:
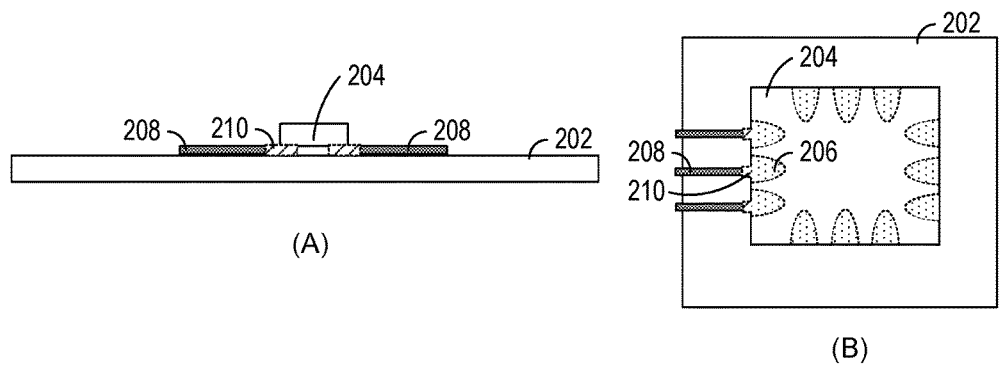
FIG. 2 schematically shows a front view and a side view of a second example electronic assembly including a flexible interconnect.

FIG. 2 shows another example device 200 comprising flexible interconnects that electrically connect a rigid component to a flexible substrate. View (A) shows a side view of the device 200, and view (B) shows a top view. The device 200 includes a flexible substrate 202. In contrast with the substrate of FIG. 1, flexible substrate 202 does not have an opening to accommodate an electronic component 204. Instead, conductive traces 208 are located on a top surface of the substrate, and the electronic component 204 is in a flipped orientation and mounted over the conductive traces 208.

Where a solid conductor, such as a solder, is used to connect the component 204 to the conductive traces 208, the solid conductor may fatigue and crack over time, thereby compromising the electrical connection between the component 204 and the conductive traces 208. Thus, FIG. 2 illustrates a flexible interconnect 210 located between at least a portion of the conductive traces 208 and the pads 206. The use of a flexible conductor in such a configuration may help to maintain the electrical connections of the pads 206 to the conductive traces 208 as the substrate 202 is flexed during use. As described above, the flexible conductor may take the form of a more viscous material, such as a conductive epoxy, or a less viscous material, such as a liquid metal comprising a gallium alloy. In examples where the conductive traces extend beneath the component 204 to contact the pads 206, the flexible interconnect 210 may be provided over an intersecting region of the conductive traces in order to reinforce an electrical and mechanical connection in an edge region of the electronic component. In other examples, the flexible interconnect 210 may bridge a gap (e.g., an air gap or other non-conductive gap) between the conductive traces and the pads. In these and other implementations, a suitable encapsulant (not shown in FIG. 2) may be used to hold a liquid metal interconnect in place. In contrast with the example of FIG. 1, the pads of the electronic component and the conductive traces contact opposite sides of the flexible interconnect.

Figure 3:
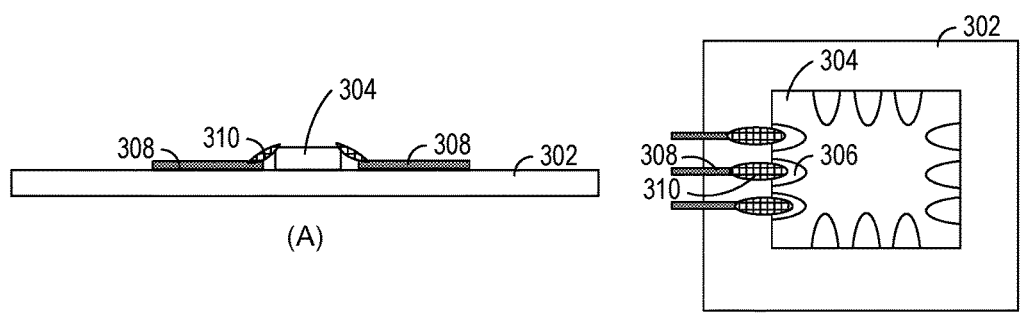
FIG. 3 schematically shows a front view and a side view of a third example electronic assembly including a flexible interconnect.

FIG. 3 shows another example of a device 300 comprising a flexible interconnect to connect an electrical trace on a flexible substrate with a contact pad on a rigid electrical component. View (A) shows a side view of the device 300, and view (B) shows a top view of the device 300. The device 300 includes a flexible substrate 302 onto which a rigid electronic component 304 is mounted.

A top surface of the electronic component 304 includes a plurality of conductive pads 306 for forming electrical connections to the component. In the example of FIG. 3, the pads 306 are facing upward away from the substrate, and a flexible interconnect 310 connects the conductive traces 308 and respective pads 306 to bridge a gap between the conductive traces and the pads, such that the pads 306 of the electronic component and the conductive traces 308 both contact a bottom surface of the interconnect 310.

Any suitable flexible conductor may be used as a flexible interconnect, including but not limited to conductive polymers (e.g. conductive epoxies), polymers comprising an electrically conductive filler, and liquid metals. Where a liquid metal such as a gallium-indium or gallium-indium-tin alloy is used (e.g. via application by a needle), a thin oxide skin that forms on the outer surface of the interconnect during formation of the interconnect may help to hold the interconnect in shape until an encapsulant is applied. In some examples, an electrically insulating support layer may be applied prior to the interconnect 310 to support an underside of the interconnect material.

FIG. 4 shows an example sequence 400 of sectional views of an electronic device during assembly. The processes illustrated via sequence 400 may be used to assemble device 100 of FIG. 1, for example. Time T1 shows a flexible substrate 404 including an opening 406 and conductive traces 408. At time T2, an adherent support (such as adhesive tape) 410 is attached to the traces 408 and the surface of the substrate 404 on which the traces are disposed. The adherent support is oriented such that the adhesive side is exposed within the opening 406.

At time T3, an electronic component 412 is inserted into the opening 406 to contact the adherent support. The electronic component is inserted with the conductive pads facing downward to contact the adherent support. At time T4, an encapsulant 414, such as a silicone elastomer or other suitable polymer, is disposed over the electronic component 412 on an opposite side of the substrate from the conductive traces. The encapsulant 414 may fill in any gaps between sides of the electronic component and sides of the opening in the substrate, and hold the component in place.

At time T5, the assembly is flipped and the adherent support 410 is removed from the substrate, traces, and electronic component. At time T6, a liquid metal layer 416 is applied over the conductive traces and electronic component to bridge a gap between the conductive traces and conductive pads of the electronic component. For example, an alloy of gallium may be deposited via a needle orifice, printing, or other suitable method onto the conductive traces and the conductive pads of the electronic component. As mentioned above, the outer surface of such an alloy, when exposed to air, forms a thin oxide layer that helps prevent the liquid metal from spreading, and thus helps retain the shape in which the liquid metal is initially deposited. As another example, a conductive epoxy may be applied. At time T7, an elastomer encapsulant 418 (e.g., which may be the same material composition as the encapsulant 414) is disposed over the interconnect, conductive traces, and electronic component to encapsulate the liquid metal circuit.

Figure 5:
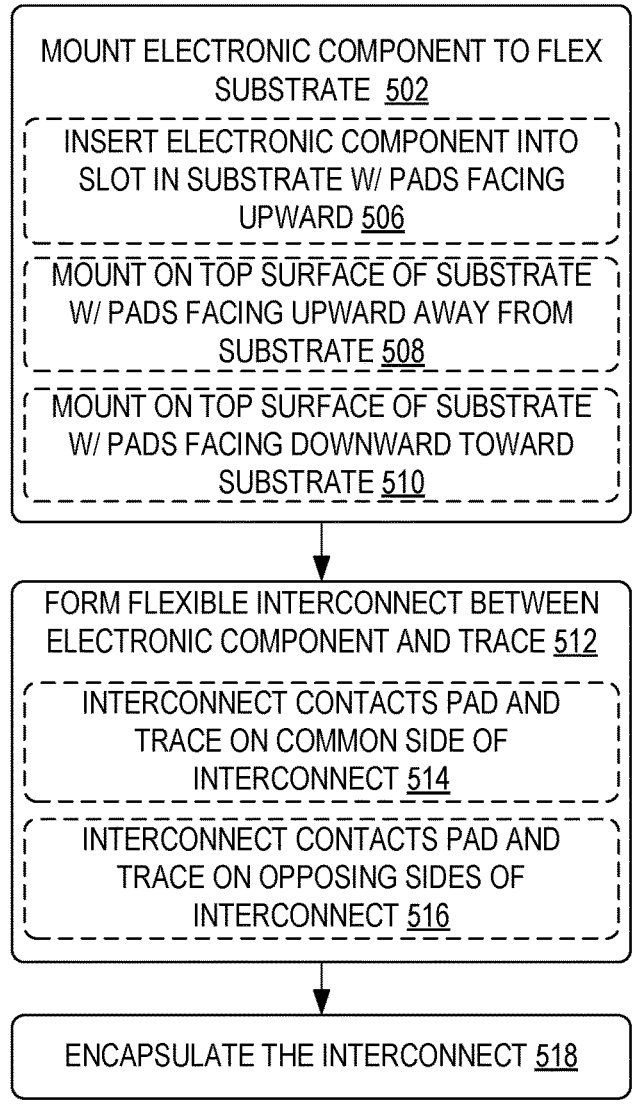
FIG. 5 shows a flow chart illustrating an example method of manufacturing a device including a flexible interconnect.

FIG. 5 shows a flow diagram depicting an example method 500 of manufacturing a device with a flexible interconnect electrically connecting an electronic component and a flexible substrate. For example, various example paths through method 500 may be used to manufacture devices 100, 200, and 300 of FIGS. 1-3.

At 502, method 500 includes mounting an electronic component to a flexible region of a substrate. As indicated at 506, in some examples mounting the electronic component to the flexible substrate may include inserting the component into a slot or other opening formed in the substrate, with conductive pads of the electronic component facing upward (e.g., on a surface facing generally a same direction as a surface of the flexible substrate on which the conductive traces are formed, as shown in FIG. 1). In other examples, as indicated at 508, mounting the electronic component may include mounting the component on a top surface of the substrate with pads facing away from the substrate (e.g., as shown in FIG. 3). In yet other examples, as indicated at 510, mounting the electronic component may include mounting the component on a top surface of the substrate with pads facing down toward the substrate (e.g. as shown in FIG. 2). A conductive trace to which the electronic component is connected may be sandwiched between the electronic component (e.g., the pads of the electronic component) and the substrate in such an example.

At 512, the method includes disposing a flexible interconnect between the electronic component and the conductive trace. In some examples, the interconnect may comprise a liquid metal, as described in more detail above with respect to FIG. 4. As indicated at 514, the interconnect may contact the pads of the electronic component and the conductive trace and/or substrate on a common side of the interconnect, as shown with devices 100 and 300 of FIGS. 1 and 3, respectively. As indicated at 516, the interconnect alternatively may contact the pad and the conductive trace on opposing sides of the interconnect, as shown with device 200 of FIG. 2. At 518, the method includes encapsulating the interconnect with a flexible material, such as a silicone polymer or other suitable elastomer.

Another example provides for a device including a flexible substrate, a conductive trace disposed on the substrate, an electronic component mounted to the substrate in a flexible region of the substrate, a liquid metal interconnect bridging between a pad on the component and the trace on the substrate, and an encapsulant covering the interconnect. In such an example, the electronic component may additionally or alternatively be positioned within a slot cut into the substrate, a top surface of the electronic component may additionally or alternatively be flush with a top surface of the substrate, and the pad may additionally or alternatively be positioned on the top surface of the electronic component. In such an example, the slot may additionally or alternatively be sized to match dimensions of the electronic component. In such an example, the slot may additionally or alternatively have a rectangular shape with rounded cutouts at one or more corners. In such an example, the electronic component and the substrate may additionally or alternatively each contact a common side of the liquid metal interconnect. In such an example, the electronic component and the substrate may additionally or alternatively contact opposing sides of the liquid metal interconnect, and the liquid metal interconnect may additionally or alternatively be sandwiched between the electronic component and the substrate. In such an example, the liquid metal interconnect may additionally or alternatively comprise a gallium alloy. Any or all of the above-described examples may be combined in any suitable manner in various implementations.

Another example provides for a method of manufacturing a device, the method including disposing a conductive trace on a flexible substrate, mounting an electronic component to the substrate in a flexible region of the substrate, applying a liquid metal interconnect extending between the electronic component and the trace to bridge between a pad on the electronic component and the trace on the substrate, and encapsulating the interconnect with an encapsulant. In such an example, mounting the electronic component may additionally or alternatively include inserting the electronic component into a slot cut into the substrate. In such an example, dimensions of the slot may additionally or alternatively match dimensions of the electronic component. In such an example, the slot may additionally or alternatively be larger than the electronic component and corners of the slot may additionally or alternatively protrude away from the electronic component. In such an example, upon inserting the electronic component into the slot, a top surface of the electronic component may additionally or alternatively be flush with a top surface of the substrate. In such an example, mounting the electronic component may additionally or alternatively include mounting the electronic component on top of the liquid metal interconnect. In such an example, mounting the electronic component may additionally or alternatively include coupling the electronic component to the liquid metal interconnect via an elastic conductor disposed between the liquid metal interconnect and a pad of the electronic component, the electronic component contacting a first surface of the liquid metal interconnect and the substrate contacting a second, opposing surface of the liquid metal interconnect. In such an example, applying the liquid metal interconnect may additionally or alternatively include applying a gallium alloy over at least a portion of the pad on the electronic component and over at least a portion of the conductive trace. Any or all of the above-described examples may be combined in any suitable manner in various implementations.

Another example provides for a device including a flexible substrate, a conductive trace disposed on the substrate, an electronic component mounted to the substrate in a flexible region of the substrate, the electronic component comprising a pad spaced from the conductive trace, and an interconnect bridging between the pad and the conductive trace to contact the pad and the trace on a common side of the interconnect, the interconnect comprising a conductive path extending from a surface of the conductive trace. In such an example, the interconnect may additionally or alternatively include a liquid metal material. In such an example, the interconnect may additionally or alternatively include a gallium alloy. In such an example, the electronic component may additionally or alternatively be positioned within a slot cut into the substrate, a top surface of the electronic component may additionally or alternatively be flush with a top surface of the substrate, and the pad may additionally or alternatively be positioned on the top surface of the electronic component. In such an example, the electronic component may additionally or alternatively be mounted to a top surface of the substrate, and the conductive trace may additionally or alternatively be disposed on the top surface of the substrate. Any or all of the above-described examples may be combined in any suitable manner in various implementations.

The examples disclosed herein may provide increased flexibility and protection against signal path breakages compared to configurations that use rigid materials to connect electronic components to flexible substrates. It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A device comprising:
    a device portion configured to move during device use;
    a flexible substrate located within the device portion configured to move during use;
    a printed conductive trace disposed on the flexible substrate to permit signals to be carried across the device portion configured to move during device use;
    an electronic component mounted to the flexible substrate at a location laterally offset along the substrate from the printed conductive trace;
    a liquid metal interconnect bridging between a pad on the component and the trace on the flexible substrate; and
    an elastomeric encapsulant covering the interconnect.

2. The device of claim 1, wherein the electronic component is positioned within a slot cut into the flexible substrate, wherein a top surface of the electronic component is flush with a top surface of the flexible substrate, and wherein the pad is positioned on the top surface of the electronic component.

3. The device of claim 2, wherein the slot is sized to match dimensions of the electronic component.

4. The device of claim 2, wherein the slot has a rectangular shape with rounded cutouts at one or more corners.

5. The device of claim 1, wherein the electronic component and the flexible substrate each contact a common side of the liquid metal interconnect.

6. The device of claim 1, wherein the electronic component and the flexible substrate contact opposing sides of the liquid metal interconnect, and wherein the liquid metal interconnect is sandwiched between the electronic component and the substrate.

7. The device of claim 1, wherein the liquid metal interconnect comprises a gallium alloy.

8. A method of manufacturing a device, the method comprising:
    disposing a printed conductive trace on a surface of a flexible substrate;
    mounting an electronic component to the surface of the substrate in a flexible region of the flexible substrate that is laterally offset along the substrate from the printed conductive trace;
    applying a liquid metal interconnect extending between the electronic component and the trace to bridge between a pad on the electronic component and the trace on the flexible substrate; and
    disposing an elastomeric encapsulant over the interconnect to encapsulate the interconnect.

9. The method of claim 8, wherein mounting the electronic component comprises inserting the electronic component into a slot cut into the flexible substrate.

10. The method of claim 9, wherein dimensions of the slot match dimensions of the electronic component.

11. The method of claim 9, wherein the slot is larger than the electronic component and wherein corners of the slot protrude away from the electronic component.

12. The method of claim 9, wherein, upon inserting the electronic component into the slot, a top surface of the electronic component is flush with a top surface of the flexible substrate.

13. The method of claim 8, wherein mounting the electronic component comprises mounting the electronic component on top of the liquid metal interconnect.

14. The method of claim 8, wherein mounting the electronic component comprises coupling the electronic component to the liquid metal interconnect via an elastic conductor disposed between the liquid metal interconnect and the pad of the electronic component, the electronic component contacting a first surface of the liquid metal interconnect and the flexible substrate contacting a second, opposing surface of the liquid metal interconnect.

15. The method of claim 8, wherein applying the liquid metal interconnect comprises printing a gallium alloy over at least a portion of the pad on the electronic component and over at least a portion of the conductive trace.

16. A device comprising:
    a device portion configured to move during device use;
    a flexible substrate located within the device portion configured to move during use;
    a printed conductive trace disposed on a surface of the flexible substrate to permit signals to be carried across the device portion configured to move during device use;
    an electronic component mounted to the surface of the flexible substrate at a location laterally offset along the substrate from the printed conductive trace, the electronic component comprising a pad spaced from the printed conductive trace; and
    an interconnect bridging between the pad and the printed conductive trace to contact the pad and the trace on a common side of the interconnect, the interconnect comprising a conductive path extending from a surface of the printed conductive trace.

17. The device of claim 16, wherein the interconnect includes a liquid metal material.

18. The device of claim 16 wherein the interconnect comprises a gallium alloy.

19. The device of claim 16, wherein the electronic component is positioned within a slot cut into the substrate, wherein a top surface of the electronic component is flush with a top surface of the flexible substrate, and wherein the pad is positioned on the top surface of the electronic component.

20. The device of claim 16, wherein the electronic component is mounted to a top surface of the flexible substrate, and wherein the conductive trace is disposed on the top surface of the flexible substrate.

* * * * *